(12) United States Patent
Kishii

(10) Patent No.: US 7,554,376 B2
(45) Date of Patent: *Jun. 30, 2009

(54) OFFSET CORRECTING METHOD, OFFSET CORRECTING CIRCUIT, AND ELECTRONIC VOLUME

(75) Inventor: Tatsuya Kishii, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/818,131

(22) Filed: Jun. 13, 2007

(65) Prior Publication Data

US 2007/0247208 A1  Oct. 25, 2007

Related U.S. Application Data

(63) Continuation of application No. 10/890,057, filed on Jul. 13, 2004, now Pat. No. 7,245,169.

(30) Foreign Application Priority Data

Jul. 14, 2003    (JP)    ............ P.2003-196563

(51) Int. Cl.
 *H03F 3/45*    (2006.01)
(52) U.S. Cl. ............... 327/307; 330/261; 330/260; 327/142
(58) Field of Classification Search ......... 327/362, 327/560–563, 259, 110, 261, 307, 142–143; 330/259, 260, 9, 110, 261
See application file for complete search history.

(56) References Cited

U.S. PATENT DOCUMENTS

| 4,032,856 | A | 6/1977 | Goldner |
| 4,097,860 | A | 6/1978 | Araseki et al. |
| 4,356,450 | A | 10/1982 | Masuda |
| 4,390,834 | A | 6/1983 | Ohshita |
| 4,395,681 | A | 7/1983 | Homung et al. |
| 4,490,682 | A | 12/1984 | Poulo |

(Continued)

FOREIGN PATENT DOCUMENTS

JP    60213108    10/1985

(Continued)

OTHER PUBLICATIONS

Korean Patent Office, "Office Action" (Feb. 21, 2006).

(Continued)

*Primary Examiner*—Dinh T. Le
(74) *Attorney, Agent, or Firm*—Pillsbury Winthrop Shaw Pittman LLP

(57) ABSTRACT

An offset correcting circuit includes: an amplifying unit including an offset adjusting unit that adjusts an offset of the amplifying unit; and an offset determining unit that that detects the offset of the amplifying unit outputs a signal for correcting the offset of the amplifying unit. The offset determining unit includes a comparing unit that compares an output of the amplifying unit with a reference value, and a counter that increases or decreases a count value in response to an output of the comparing unit. The offset adjusting unit adjusts the offset based on the count value and includes a bias varying portion for varying a bias of the amplifying unit based on the output of the counter.

4 Claims, 8 Drawing Sheets

U.S. PATENT DOCUMENTS

| | | | |
|---|---|---|---|
| 4,810,973 | A | 3/1989 | Kurz |
| 5,061,900 | A | 10/1991 | Vinn et al. |
| 5,087,914 | A | 2/1992 | Sooch et al. |
| 5,395,078 | A * | 3/1995 | Gellender .................. 246/249 |
| 5,789,974 | A | 8/1998 | Ferguson et al. |
| 6,054,887 | A | 4/2000 | Horie et al. |
| 6,111,965 | A | 8/2000 | Lubbe et al. |
| 6,426,663 | B1 | 7/2002 | Manlove et al. |
| 6,556,154 | B1 | 4/2003 | Gorecki et al. |
| 6,710,645 | B2 | 3/2004 | Isken et al. |
| 2005/0168278 | A1 | 8/2005 | Chung |

FOREIGN PATENT DOCUMENTS

| | | |
|---|---|---|
| JP | 61043005 | 3/1986 |
| JP | 62-247611 | 10/1987 |
| JP | 62258508 | 11/1987 |
| JP | 3-34711 | 2/1991 |
| JP | 4-185018 | 7/1992 |
| JP | 5251944 | 9/1993 |
| JP | 7-263985 | 10/1995 |
| JP | 9-646666 | 3/1997 |
| JP | 10-233711 | 9/1998 |
| JP | 11-88071 | 3/1999 |
| JP | 11088071 | 3/1999 |
| JP | 2000-68766 | 3/2000 |
| TW | 519617 B | 2/2003 |

OTHER PUBLICATIONS

Notice of Allowance and Fee(s) Due (U.S. Appl. No. 10/890,057, Mar. 13, 2007).

U.S. Office Action (U.S. Appl. No. 10/890,057, dated Aug. 14, 2006).

Office Action: Republic of China, Bureau of Intellectual Property, The Ministry of Economy (Dated Aug. 22, 2007).

Korean Patent Office, "Office Action," (Feb. 21, 2006).

Office Action: Republic of China (Issued Mar. 27, 2008).

Office Action, Japanese Application No. 2003-196563, dated Jul. 15, 2008 (2 pgs.).

Japanese Patent Office: Notification of Reason(s) for Rejection, Application No. 2003-196563, dated Jul. 15, 2008.

* cited by examiner

OFFSET CORRECTING METHOD, OFFSET CORRECTING CIRCUIT, AND ELECTRONIC VOLUME

RELATED APPLICATION

This application is a continuation application of U.S. patent application Ser. No. 10/890,057, filed Jul. 13, 2004, now U.S. Pat. No. 7,245,169.

BACKGROUND OF THE INVENTION

The present invention relates to an offset correcting method, an offset correcting circuit, and an electronic volume suitable for offset correction of the electronic volume.

In the related art, there is the electronic volume in which the amplifier circuits, etc. are employed as constituent elements and whose gain is controlled by the digital signal. In the situation that DC offset is contained in the output of this electronic volume, DC potential of the output is changed and thus the noise is generated when the gain of the amplifier circuit is varied.

Meanwhile, the offset voltage of the OP amplifier as one of the amplifier circuits is varied depending upon the temperature variation, the age-based change, and the like. For this reason, the correction of the offset voltage executed only in the manufacturing stage of the OP amplifier does not make it possible to correct the offset voltage generated depending upon the temperature variation, the age-based change, and the like. In order to settle this problem, the circuit for correcting the offset voltage at the manufacturing stage et seq. of the OP amplifier was proposed.

As such offset voltage correcting circuit in the related art, the circuit for executing the offset voltage correction by measuring the offset voltage of the OP amplifier and then adding the offset voltage to the input signal of the OP amplifier as a correction value was proposed (see JP-B-2888833, for example).

Further, as the offset voltage correcting circuit in the related art, the circuit for executing the offset voltage correction by adding MOS transistors in series with respective load transistors in the input differential portion of the OP amplifier, then connecting capacitors between the gates and the drains of respective MOS transistors, and then adjusting charge voltages of both capacitors to change gate voltages of the MOS transistors was proposed.

Normally, it is difficult to arrange the capacitor with a large capacitance value in the chip of the OP amplifier. Therefore, in the above offset voltage correcting circuit in the related art, since the electric charge charged in the capacitor is discharged in a short time at the end of the correction, the correction must always be executed in a predetermined period. For this reason, in the related art, the offset voltage correcting circuit for correcting the offset voltage of the OP amplifier by using the comparing element (comparator), which compares the output voltage of the OP amplifier with a predetermined reference voltage, without the capacitor was proposed (see JP-A-11-88071, for example).

However, in the offset voltage correcting circuit set forth in JP-B-2888833, since the correction value is added to the input signal of the OP amplifier, there is a fear that the dynamic range, the distortion factor, input/output impedances, etc. of the OP amplifier are deteriorated. Therefore, when the electronic volume is constructed by using the offset voltage correcting circuit set forth in JP-B-2888833, the dynamic range, the distortion factor, input/output impedances, etc. of such electronic volume may be deteriorated.

In the offset voltage correcting circuit set forth in JP-A-11-88071, in order to eliminate (cancel) the offset of the OP amplifier with high precision, the comparator, etc. for sensing the offset value of the OP amplifier requires the high-precision performance. It is not easy to design and manufacture such high-precision comparator and also a great production cost is needed.

When the offset is contained in the OP amplifier as the constituent element of the electronic volume, the noise is generated due to the offset value. In addition, in the electronic volume having an amplifying function, the noise due to such offset value is amplified in response to the amplification factor and then output. As a result, in the related art, in case it is intended to manufacture the electronic volume that can eliminate the offset of the OP amplifier with high precision and generate no noise, such problems occurs that it is not easy to design and manufacture such electronic volume and also an enormous production cost is needed.

SUMMARY OF THE INVENTION

The present invention has been made to overcome the above problems, and it is an object of the present invention to provide an offset correcting method, an offset correcting circuit, and an electronic volume capable of reducing simply an offset of an amplifier circuit with high precision.

It is another object of the present invention to provide an offset correcting method, an offset correcting circuit, and an electronic volume capable of reducing simply an offset of the electronic volume with high precision.

It is still another object of the present invention to provide an offset correcting method, an offset correcting circuit, and an electronic volume capable of reducing simply the noise generated in the electronic volume to cause the offset of the amplifier circuit with high precision.

In order to overcome the above problems, the present invention is constructed as follows.

An offset correcting circuit comprising:
an amplifying unit including an offset adjusting unit that adjusts an offset of the amplifying unit; and
an offset determining unit that detects the offset of the amplifying unit outputs a signal for correcting the offset of the amplifying unit, the offset determining unit including,
a comparing unit that compares an output of the amplifying unit with a reference value, and
a counter that increases or decreases a count value in response to an output of the comparing unit,
wherein the offset adjusting unit adjusts the offset based on the count value, and includes a bias varying portion for varying a bias of the amplifying unit based on the output of the counter.

The offset correcting circuit according to claim 1 further including:
a power-ON detecting unit that detects a power ON signal to output a reset signal which causes the offset determining unit to start correcting the offset.

The offset correcting circuit according to claim 1, wherein the offset adjusting unit further includes a variable resistor portion which is a part of a first-stage amplifying portion of the amplifying unit.

An electronic volume setting circuit comprising:
an inputting portion to which an input signal is input;
an amplifying unit that amplifies the input signal;
an outputting portion that outputs an output signal from the amplifying unit;

a variable resistor that negatively feeds back the output signal output from the amplifying unit to an input of the amplifying unit, wherein the amplifying unit and the variable resistor constitute a gain varying unit that varies a gain of the electronic volume setting circuit;

an offset determining unit that determines an offset that includes a comparing unit for comparing an output signal output from the outputting portion with a reference value, and a counter for executing an up-count or a down-count in response to an output of the comparing unit; and an offset adjusting unit that adjusts the offset and includes a bias varying portion for varying a bias of the amplifying unit based on an output of the counter.

The electronic volume setting circuit according to claim 4 further including:

a power-ON detecting unit that detects a power ON signal to output a reset signal which causes the offset determining unit to start correcting the offset.

The electronic volume setting circuit according to claim 4, wherein the offset adjusting unit further includes a variable resistor portion which is a part of a first-stage amplifying portion of the amplifying unit.

DETAILED DESCRIPTION OF PREFERRED EMBODIMENTS

An embodiment of the present invention will be described with reference to the drawings hereinafter.

Figure 1:
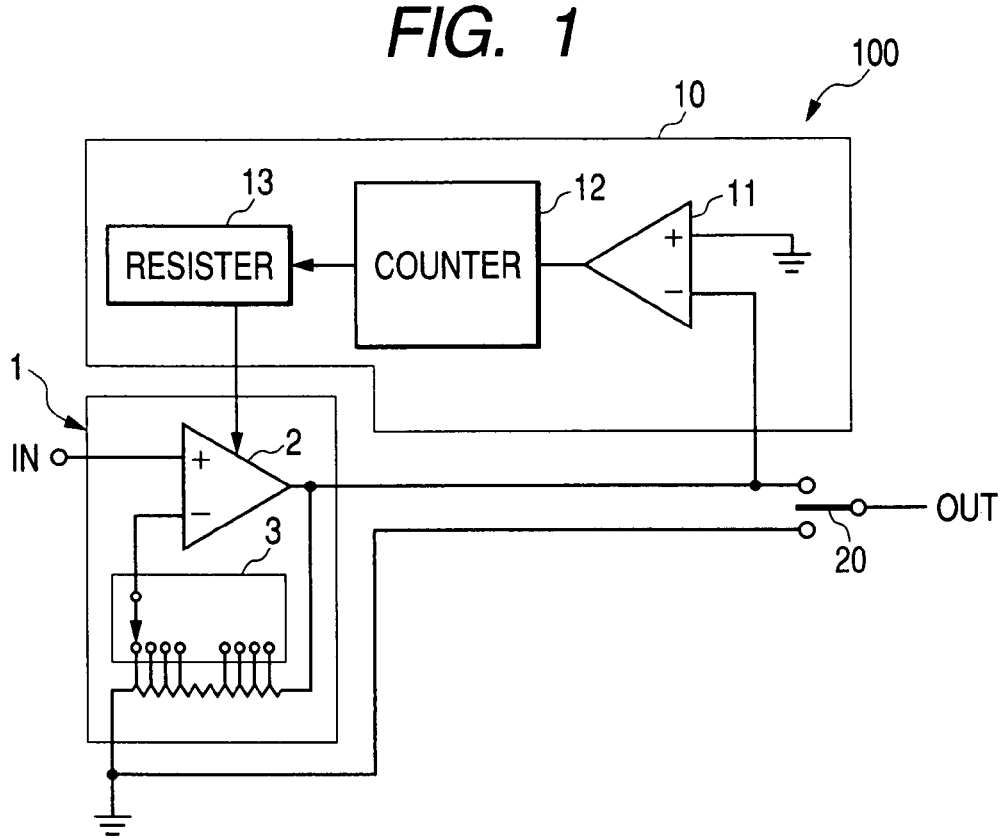
FIG. 1 is a block diagram of an electronic volume according to an embodiment of the present invention.

FIG. 1 is a block diagram showing an example of a schematic configuration of an electronic volume according to an embodiment of the present invention.

SCHEMATIC CONFIGURATIVE EXAMPLE

An electronic volume 100 shown in FIG. 1 amplifies an input signal input into an input terminal (IN) with a predetermined gain, and then outputs this amplified signal from an output terminal (OUT) as an output signal. This electronic volume 100 includes a gain varying portion 1 for varying a resistance value (impedance) in response to a signal supplied from the outside, and an offset determining circuit 10 constituting an offset correcting circuit for correcting the offset of the gain varying portion 1. The gain varying portion 1 includes an OP amplifier 2 acting as an amplifier circuit, and a variable resistor 3 for negatively feeding back an output of the OP amplifier 2.

Therefore, a gain (amplification factor) of the gain varying portion 1 including the OP amplifier 2 and the variable resistor 3 can be controlled by varying the variable resistor 3 based on the external signal. Then, the offset determining circuit 10 constitutes an offset correcting circuit that corrects the offset of the OP amplifier 2 as a constituent element of the gain varying portion 1.

Figure 2:
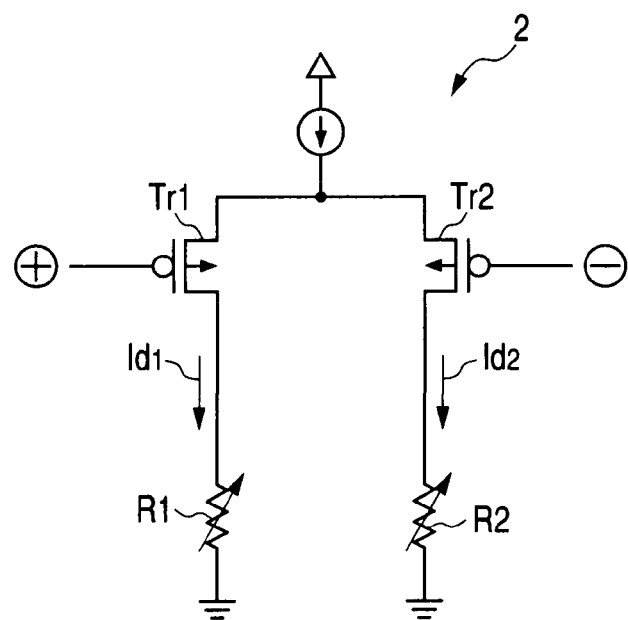
FIG. 2 is a circuit diagram of a first-stage amplifying portion of an OP amplifier in the above electronic volume.

The OP amplifier 2 has amplifying portions in plural stages. FIG. 2 is a circuit diagram showing a first-stage amplifying portion of the OP amplifier 2. The first-stage amplifying portion of the OP amplifier 2 constitutes a differential amplifier circuit, and has a constant-current source, transistors Tr1, Tr2, and variable resistors R1, R2 as constituent elements. Respective current input terminals of the transistors Tr1, Tr2 are connected to the constant-current source. A current output end of the transistor Tr1 is connected to one end of the variable resistor R1, while a current output end of the transistor Tr2 is connected to one end of the variable resistor R2. The other end of the variable resistor R1 and the other end of the variable resistor R2 are connected to the ground respectively. Then, a control end of the transistor Tr1 constitutes a plus-side input terminal of the OP amplifier 2, while a control end of the transistor Tr2 constitutes a minus-side input terminal of the OP amplifier 2.

The offset determining circuit 10 varies a value of the variable resistor R1 or the variable resistor R2 in the OP amplifier 2 constructed in this manner. Thus, an offset of the OP amplifier 2 is corrected and reduced substantially into zero.

In this configuration, a degree of influence of an offset voltage Voffset of the OP amplifier 2 when the variable resistor R1 is varied, for example, can be given by following Expression.

$$V\text{offset} = Id_1 \times (\Delta R_1/R_1)/gm$$

where $Id_1$ is a current flowing through the variable resistor R1, gm is a mutual conductance of the transistor Tr, $R_1$ is a resistance value of the variable resistor R1, and $\Delta R_1$, is change in the resistance value of the variable resistor R1.

The offset determining circuit 10 is constructed to have a comparator 11, a counter 12, and a register 13. In this case, when an offset of the comparator 11 itself is large, the offset correction precision of the offset determining circuit 10 is deteriorated. However, in the present embodiment, since the gain of the gain varying portion 1 is increased upon determining the offset, the offset correction can be carried out with satisfactorily high precision by using the normal comparator or OP amplifier. For this reason, the OP amplifier can be used as the comparator 11. Now, if the count value can be held in the counter 12, an output of the counter 12 may be output directly to the gain varying portion 1 and thus the register 13 may be omitted herein.

An output terminal of the gain varying portion 1 is connected to a minus-side terminal of the comparator 11. A plus-side terminal of the comparator 11 is connected to the ground. In this case, the plus-side terminal and the minus-side terminal of the comparator 11 may be connected alternately so as to meet to the offset correcting method of the counter 12 and the OP amplifier 2.

An output terminal of the comparator 11 is connected to an input terminal of the counter 12. An output terminal of the counter 12 is connected to an input terminal of the register 13. An output terminal of the register 13 is connected to an offset control terminal of the gain varying portion 1. The offset of the OP amplifier 2 is controlled based on a value of the register 13 given to the offset control terminal. An output terminal is connected to the output of the gain varying portion 1 or the ground via a switch 20.

SCHEMATIC OPERATIONAL EXAMPLE

The offset of the gain varying portion 1 is corrected by the offset determining circuit 10 at the time when a power supply of the gain varying portion 1 is turned ON, i.e., a power supply of the OP amplifier 2 is turned ON. It is preferable that the offset correction of the gain varying portion 1 should be executed as a part of initialization sequence of the gain varying portion 1 (or the device containing the gain varying portion 1).

Then, in order to prevent the generation of an abnormal situation by the output of the gain varying portion 1, the output (OUT) is separated from the electronic volume by the switch 20 and connected to the ground (the analog reference potential) at the time of turning the power supply ON and at the time of correcting the offset.

The amplification factor of the gain varying portion 1 is set large (e.g., the maximum value) by the offset determining circuit 10 at the time of correcting the offset. This setting of the amplification factor is carried out by outputting a signal, which controls a value of the variable resistor 3 (e.g., a switch is connected to a tap that is closest to the ground), from the offset determining circuit 10 at the time of turning the power supply ON. In this manner, the offset sensing is facilitated by setting the amplification factor large. At this time, it is preferable that the plus-side input terminal of the OP amplifier 2 should be connected to the ground to remove the influence from the input (IN). In addition, if the output (OUT) is connected to the ground terminal of the variable resistor 3, the influence of the outside can be reduced small.

In this situation, the offset determining circuit 10 receives the output of the gain varying portion 1, then determines (detects) the offset of the gain varying portion 1 (the offset of the OP amplifier 2), and then adjusting the offset of the first-stage amplifier portion of the OP amplifier 2 based on the determined result by using the digital control. The offset adjustment of the first-stage amplifier portion of the OP amplifier 2 is carried out by variably controlling the variable resistors R1, R2 shown in FIG. 2. Such variable control is executed based on above Expression that indicates a degree of influence of the offset voltage Voffset of the OP amplifier 2.

The offset determination in the offset determining circuit 10 is carried out as follows. For example, when the offset is generated on the plus side, the comparator 11 outputs a signal that corresponds to the result of the comparison between the output voltage of the OP amplifier 2 with a reference value (ground potential). Then, the counter 12 decrements (or increments) the count value by a value that corresponds to a magnitude of the offset. Then, the register 13 receives and holds the count value of the counter 12, and also outputs a signal to decrease (or increase) a value of the variable resistor R2 (or the variable resistor R1) of the OP amplifier 2. As a result, the offset of the OP amplifier 2 can be substantially eliminated.

In contrast, when the offset is generated on the minus side, the comparator 11 outputs a signal that corresponds to the result of the comparison between the output voltage of the OP amplifier 2 and the reference value (ground potential). Then, the counter 12 increments (or decrements) the count value by a value that corresponds to a magnitude of the offset. Then, the register 13 receives and holds the count value of the counter 12, and also outputs a signal to decrease (or increase) a value of the variable resistor R1 (or the variable resistor R2) of the OP amplifier 2. As a result, the offset of the OP amplifier 2 can be substantially eliminated.

In this way, the offset determining circuit 10 can convert an analog value as the offset value of the gain varying portion 1 into a digital signal and then adjust the variable resistors R1, R2 of the OP amplifier 2 based on the digital signal to eliminate the offset of the gain varying portion 1. If the offset value obtained at this time is held in the register as the digital signal, subsequently the electronic volume 100 can be operated in its no offset state.

According to the present embodiment, since the gain (amplification factor) of the gain varying portion 1 is set large at the time when the offset correction of the gain varying portion 1 is executed, the offset is also amplified by such amplification factor and then input into the offset determining circuit 10. Therefore, according to the present embodiment, the offset correction of the gain varying portion 1 can be executed while reducing the influence upon the precision of the comparator 11, and thus the offset correction can be executed with high precision by using the normal OP amplifier, or the like as the comparator 11.

According to the present embodiment, since the offset correction is executed at the time when the power supply of the gain varying portion 1 is turned ON, the offset of such amplifier circuit can be eliminated with high precision in response to the circuit condition, the ambient temperature, and the like at the time when the power supply is turned ON. According to the present embodiment, the offset of the gain varying portion 1 can be eliminated every time when the power supply of the gain varying portion 1 is turned ON, i.e., every initialization sequence of the gain varying portion 1. As a result, even though the characteristics of the element constituting the OP amplifier 2 are varied by the temperature variation, the age-based change, and the like, the offset of the OP amplifier 2 can be eliminated simply with high precision.

According to the present embodiment, it is no necessary to add a special input signal to the gain varying portion 1 or the OP amplifier 2. Therefore, the offset of the gain varying portion 1 can be eliminated with high precision not to deteriorate the dynamic range, the distortion factor, input/output impedances, etc. of the gain varying portion 1.

As a consequence, as described above, the electronic volume 100 according to the present embodiment can provide the electronic volume in which the noise generation is extremely small since the offset of the amplifier circuit (the OP amplifier 2) can be corrected precisely.

PARTICULAR CONFIGURATIVE EXAMPLE

Figure 3:
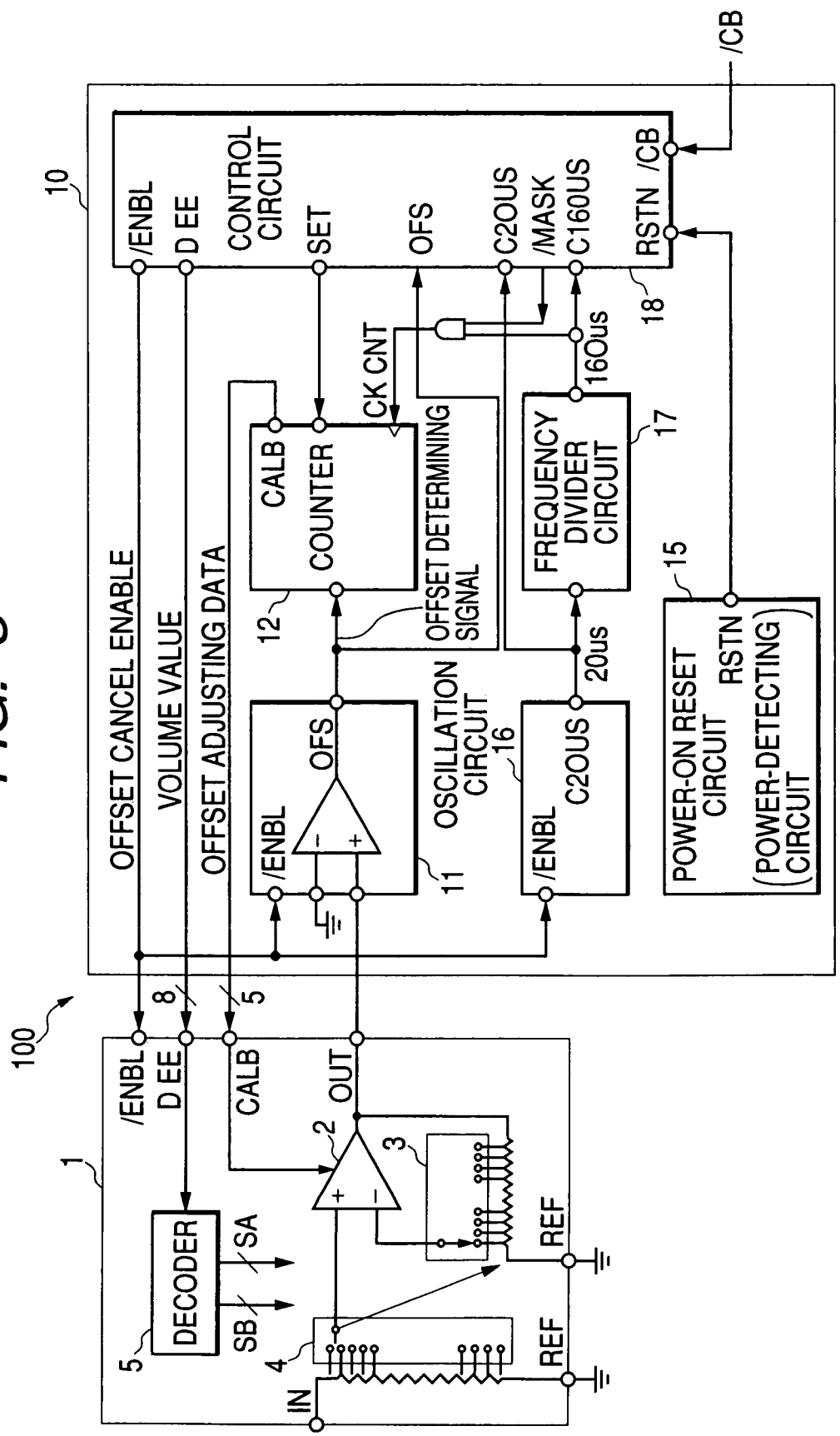
FIG. 3 is a block diagram showing a particular configurative example of the above electronic volume.

Next, a particular configurative example of the above electronic volume 100 will be explained with reference to FIG. 3 to FIG. 7 hereunder. FIG. 3 is a block diagram showing a particular configurative example of the electronic volume 100. The electronic volume 100 includes the gain varying portion 1 and the offset determining circuit 10, like the electronic volume 100 shown in FIG. 1. Here, in FIG. 3, assume that the elements indicated by the same symbols as those in FIG. 1 have the same functions.

The gain varying portion 1 includes the OP amplifier 2, the variable resistor 3 for negatively feeding back the output of the OP amplifier 2, a variable resistor 4 for voltage-dividing the input signal of the OP amplifier 2, and a decoder 5 for controlling the variable resistors 3, 4 based on the external signal. The decoder 5 controls resistance values of the variable resistors 3, 4 by receiving a volume value signal (gain control signal) DEE output from the offset determining circuit 10 and then outputting signals SA, SB based on the volume value signal DEE. The OP amplifier 2 is subjected to the offset correction by variably controlling the attribute (resistance value) of the constituent element based on an offset adjusting data signal CALB output from the offset determining circuit 10.

The offset determining circuit 10 includes the comparator 11, the counter 12, a power-ON reset circuit 15, an oscillation circuit 16, a frequency divider circuit 17, and a control circuit 18. An output terminal of the gain varying portion 1 is connected to the plus-side input terminal of the comparator 11. The minus-side input terminal of the comparator 11 is connected to the ground.

The comparator 11 outputs an offset determining signal OFS. Then, the output terminal of the comparator 11 is connected to the input terminal of the counter 12. The output terminal of the counter 12 is connected to the input terminal of the gain varying portion 1. Then, the counter 12 outputs the offset adjusting data signal CALB to the gain varying portion 1. The register 13 shown in FIG. 1 is omitted herein. This is because the counter 12 is controlled to hold the data (described later). The count value (the initial value, or the like) of the counter 12 is set by a set signal SET output from the control circuit 18. A clock signal CKCNT that is input into the counter 12 is generated by calculating a logical product between an output signal /MASK of the control circuit 18 and an output signal 160US of the frequency divider circuit 17.

A clock signal C20US (e.g., a period 20 μs) of the oscillation circuit 16 is input into the frequency divider circuit 17 and the control circuit 18. The frequency divider circuit 17 divides the frequency of the input signal into ⅛ and outputs the divided signal. The power-ON reset circuit 15 outputs a reset signal RSTN to the control circuit 18 when the power supply of the electronic volume 100 is turned ON, and thus acts as a power-ON detecting means for detecting that the power supply is turned ON.

The control circuit 18 controls the overall operation of the electronic volume 100, and outputs an offset cancel·enable signal /ENBL to the gain varying portion 1, the comparator 11, and the oscillation circuit 16. The control circuit 18 outputs the volume value signal DEE to control the amplification factor (gain) of the gain varying portion 1. The offset determining signal OFS output from comparator 11, etc. are input into the control circuit 18.

Figure 4:
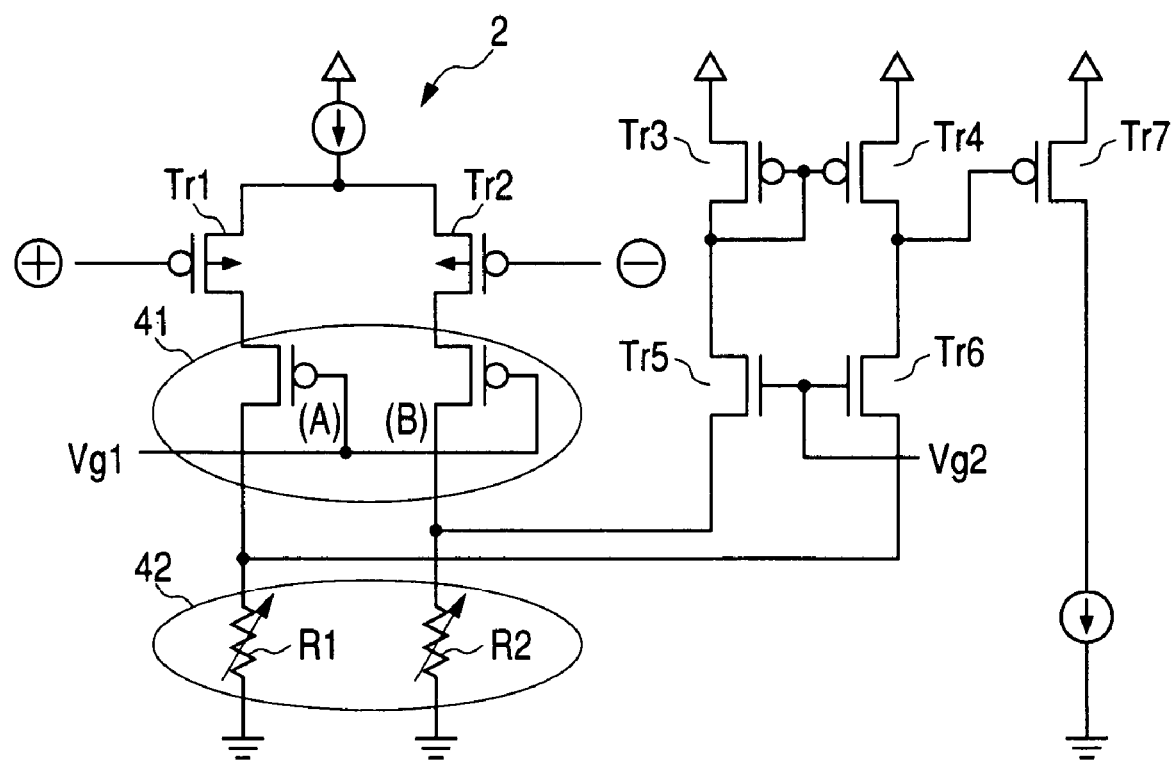
FIG. 4 is a pertinent circuit diagram of the OP amplifier in the above electronic volume.

Next, a particular configurative example of the OP amplifier 2 constituting a constituent element of the gain varying portion 1 will be explained with reference to FIG. 4 to FIG. 6 hereunder. FIG. 4 is a pertinent circuit diagram showing a configurative example of the OP amplifier 2. The OP amplifier 2 is constructed to have transistors Tr1, Tr2, Tr3, Tr4, Tr5, Tr6, Tr7, a bias varying portion 41, a variable resistor portion 42 consisting of the variable resistors R1, R2, and two constant-current sources. The transistors Tr1, Tr2, the bias varying portion 41, and the variable resistors R1, R2 constitute the first-stage amplifier portion. The transistors Tr3, Tr4, Tr5, Tr6, Tr7 constitute a second-stage amplifier portion.

Figure 5:
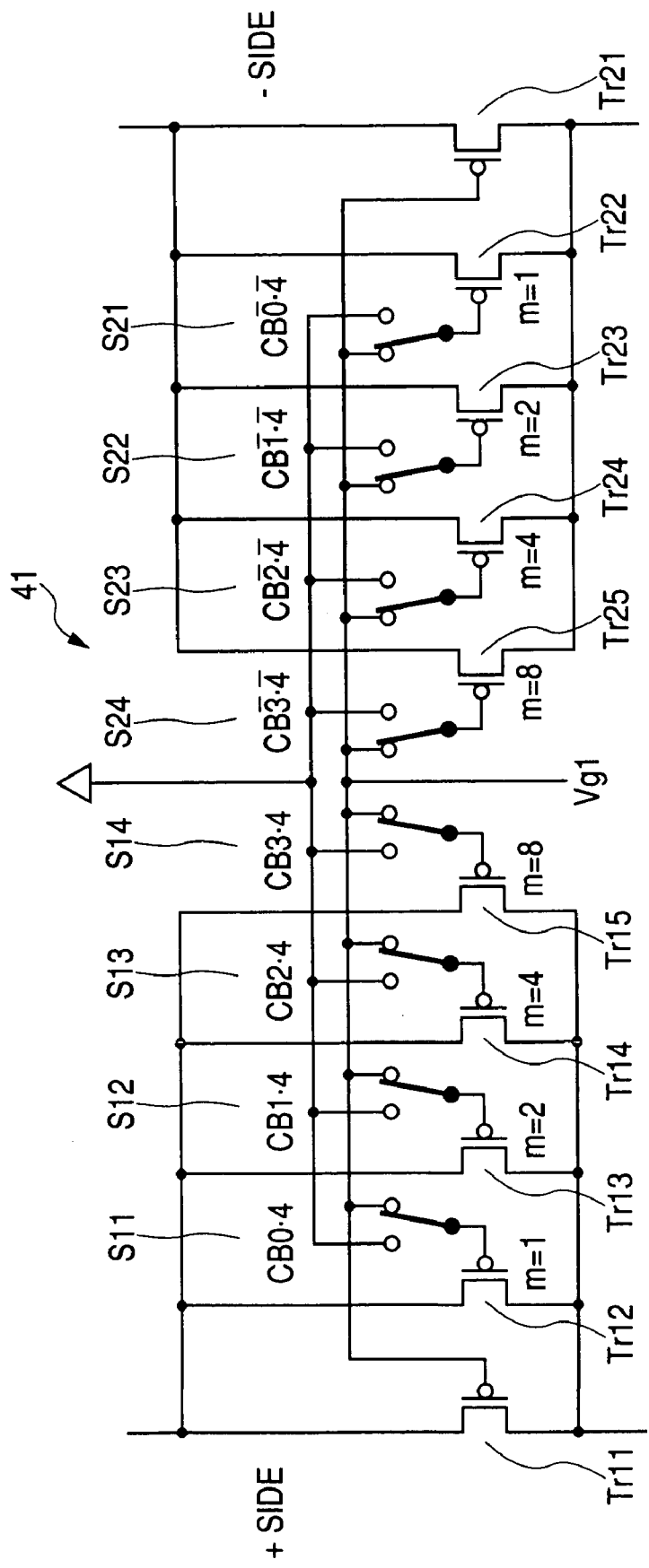
FIG. 5 is a circuit diagram showing a part of a bias varying portion of the above OP amplifier.

FIG. 5 is a circuit diagram showing a particular example of the bias varying portion 41 in FIG. 4. The bias varying portion 41 is constructed by a plus-side circuit that consists of transistors Tr11, Tr12, Tr13, Tr14, Tr15 and switches S11, S12, S13, S14, and a minus-side circuit that consists of transistors Tr21, Tr22, Tr23, Tr24, Tr25 and switches S21, S22, S23, S24. This plus-side circuit is provided between the transistor Tr1 and the variable resistor R1. The minus-side circuit is provided between the transistor Tr2 and the variable resistor R2. Suppose that a width and a length of each transistor are set to W and L respectively, a ratio is W/L=m, and the ratio m of the transistor Tr12 is set to 1, the transistor Tr13 has 2 m, the transistor Tr14 has 4 m, and the transistor Tr15 has 8 m. That is, the transistor Tr13 is equivalent to a transistor that is constructed by connecting two transistors each corresponding to the transistor Tr12 in parallel with each other. The transistor Tr14 is equivalent to a transistor that is constructed by connecting four transistors each corresponding to the transistor Tr12 in parallel with each other. The transistor Tr15 is equivalent to a transistor that is constructed by connecting eight transistors each corresponding to the transistor Tr12 in parallel with each other. The ratio m of the transistor Tr12 is equal to that of the transistor Tr22.

Then, input/output terminals of the transistors Tr11, Tr12, Tr13, Tr14, Tr15 are connected in parallel with each other respectively. Input/output terminals of the transistors Tr21, Tr22, Tr23, Tr24, Tr25 are connected in parallel with each other respectively. The switches S11, S12, S13, S14 are switches to decide whether or not a predetermined voltage Vg1 should be applied to respective gates of the transistors Tr12, Tr13, Tr14, Tr15.

The switches S21, S22, S23, S24 are switches to decide whether or not the predetermined voltage Vg1 should be applied to respective gates of the transistors Tr22, Tr23, Tr24, Tr25. Then, the switches S11, S12, S13, S14, S21, S22, S23, S24 are controlled by the offset adjusting data signal CALB output from the offset determining circuit 10. Each switch is controlled in such a way that the gate of each transistor is connected to Vg1 when the control signal is "0" whereas the gate of each transistor is connected to the power supply (the transistor is turned OFF) when the control signal is "1".

Here, the offset adjusting data signal CALB is converted into signals CB0•4, CB1•4, CB2·4, CB3•4, /(CB0)•4, /(CB1)•/4, /(CB2)•/4, /(CB3)•/4, which controls the switches S11, S12, S13, S14, S21, S22, S23, S24 respectively, by a decoder 21 (described later) in the gain varying portion 1.

In the above, a "/" symbol signifies an inverted signal of the signal that is subsequent to this symbol, and signifies the "negative logic" in the logical symbol. For example, /(CB0) is the inverted signal of the signal CB0. "/(CB0)•/4" signifies a logical product between the inverted signal of the signal CB0 and the inverted signal of the signal CB4. These representations are similarly applied to the following description.

Figure 6:
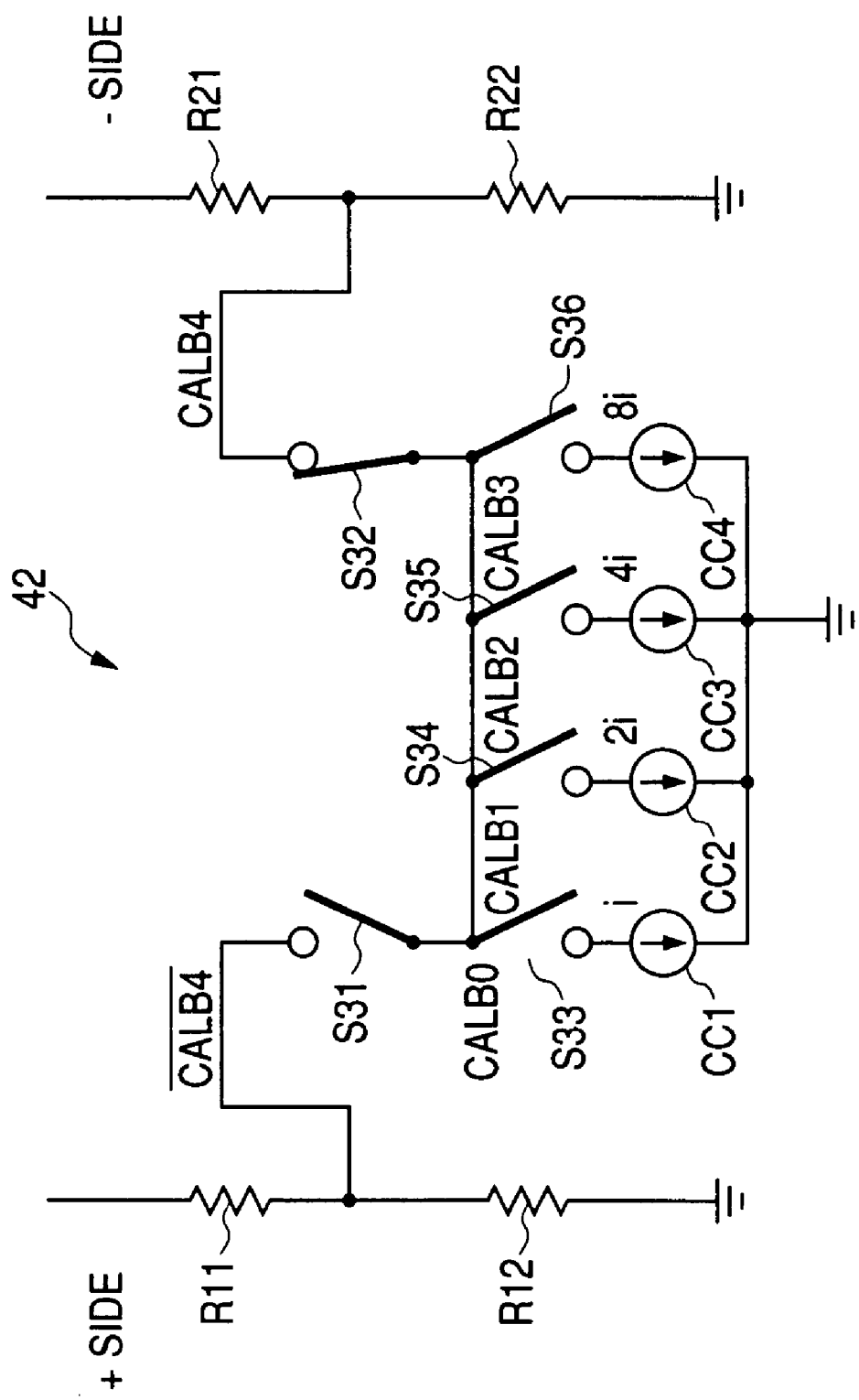
FIG. 6 is a circuit diagram of a variable resistor portion in the first-stage amplifier circuit of the above OP amplifier.

FIG. 6 is a circuit diagram showing a particular configurative example of the variable resistor portion 42 consisting of the variable resistors R1, R2 in the OP amplifier 2. The variable resistor portion 42 is composed of resistors R11, R12, R21, R22, switches S31, S32, S33, S34, S35, S36, and constant-current sources CC1, CC2, CC3, CC4.

Respective constant-current sources are set in such a manner that, if a current of the constant-current source CC1 is defined as i, the constant-current source CC2 has a twice current 2i, the constant-current source CC3 has a triple current 3i, and the constant-current source CC2 has a quadruple current 4i.

Switches S31, S32, S33, S34, S35, S36 are controlled by the offset adjusting data signal CALB respectively. For example, suppose that the offset adjusting data signal CALB is composed of a 5-bit (from the 0-th bit as LSB to the 4-th bit as MSB) digital signal. Then, suppose that the switches S31, S32 are controlled by the 4-th bit of the offset adjusting data signal CALB, the switch S33 is controlled by the 0-th bit of the offset adjusting data signal CALB, the switch S34 is controlled by the 1-st bit of the offset adjusting data signal CALB, the switch S35 is controlled by the 2-nd bit of the offset adjusting data signal CALB, and the switch S36 is controlled by the 3-rd bit of the offset adjusting data signal CALB.

In this manner, respective characteristics of the plus-side constituent elements and the minus-side constituent elements of a differential amplifier circuit, which constitutes the first-stage amplifier circuit in the OP amplifier 2 in the gain varying portion 1, are individually controlled by the offset adjusting data signal CALB in a digital fashion respectively. As a result, the offset of the OP amplifier 2 in the gain varying portion 1 can be corrected precisely and simply by the offset adjusting data signal CALB.

Figure 7:
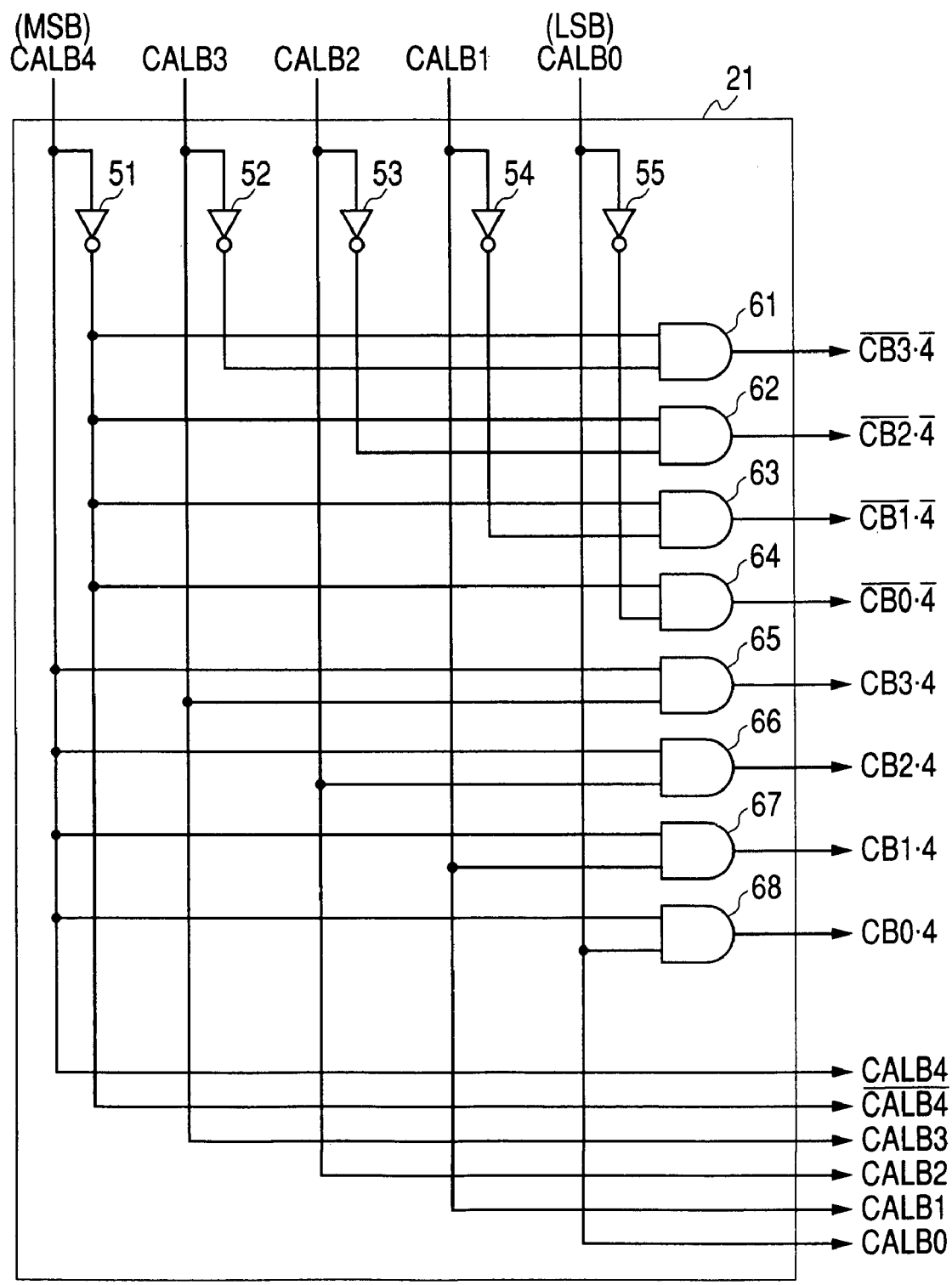
FIG. 7 is a circuit diagram showing an offset adjusting decoder in the above electronic volume.

FIG. 7 is a circuit diagram showing a configurative example of the decoder 21 that is a constituent element of the gain varying portion 1 and converts the offset adjusting data signal CALB into desired signals. The decoder 21 is composed of inverters 51, 52, 53, 54, 55 and AND circuits 61, 62, 63, 64, 65, 66, 67, 68. Then, the decoder 21 converts the offset adjusting data signal CALB into the signals CB0•4, CB1•4, CB2•4, CB3•4, /(CB0)•/4, /(CB1)•/4, /(CB2)•/4, /(CB3)•/4, which controls the switches S11, S12, S13, S14, S21, S22, S23, S24 respectively, and then outputs these signals.

PARTICULAR OPERATIONAL EXAMPLE

Figure 8:
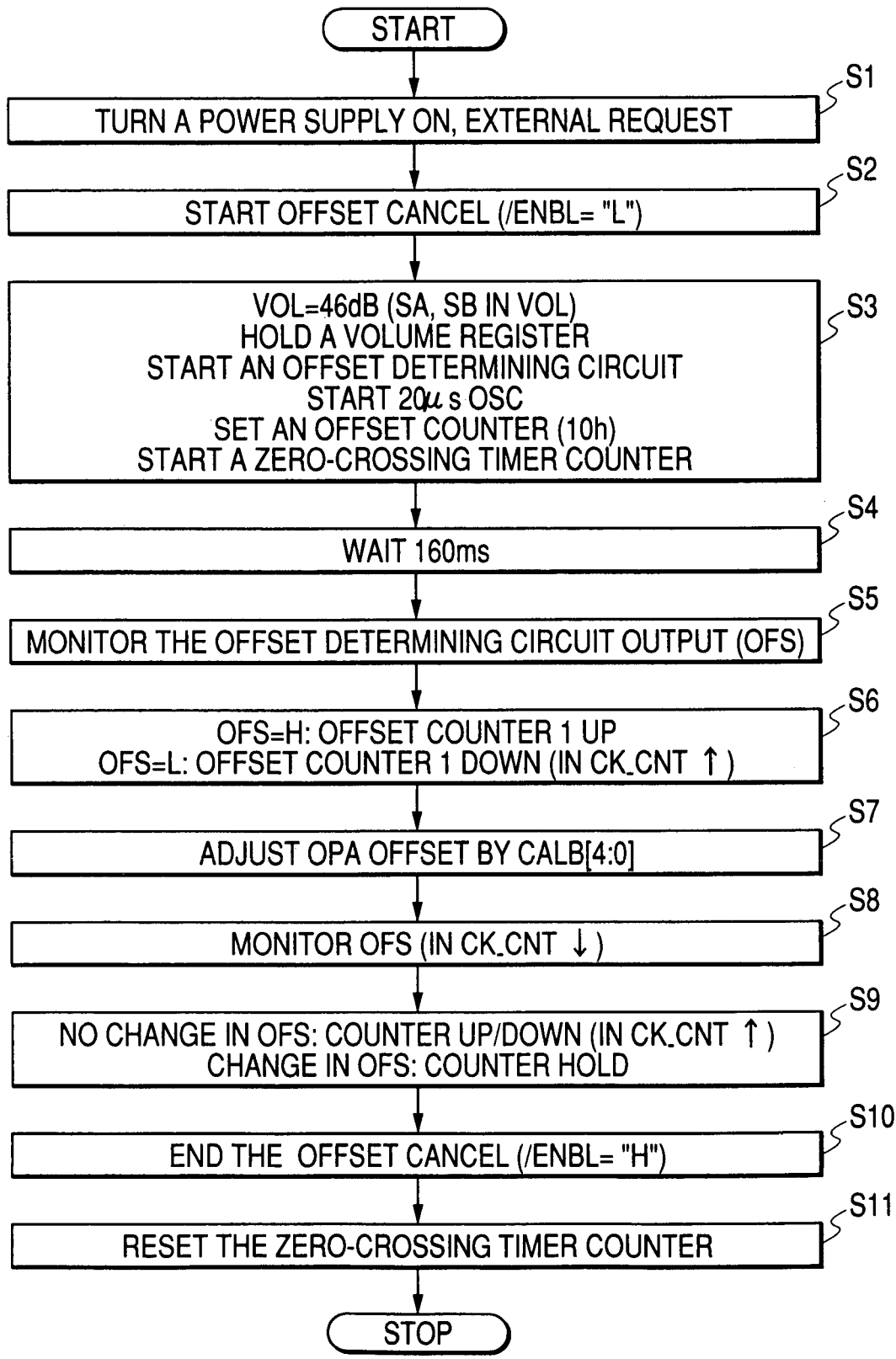
FIG. 8 is a flowchart showing an operation of the above electronic volume.
Figure 9:
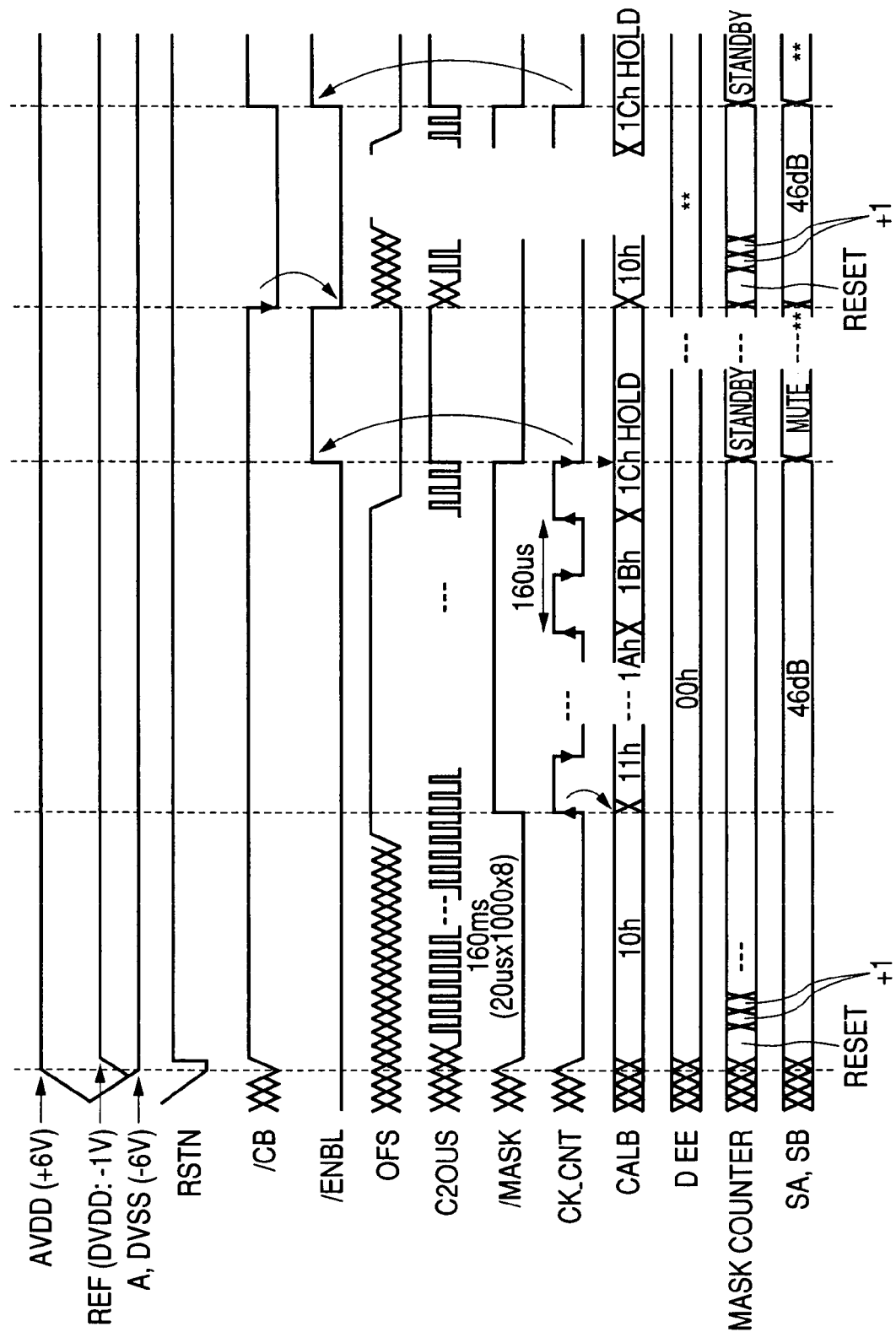
FIG. 9 is a timing chart showing signals in respective portions in the above electronic volume.

Next, a particular operation of the above electronic volume 100 will be explained with reference to FIG. 8 and FIG. 9 hereunder. FIG. 8 is a flowchart showing a particular operational example of the electronic volume 100. FIG. 9 is a timing chart showing signals in respective portions in the electronic volume 100 shown in FIG. 3.

First, the power-ON is set by turning the power supply of the electronic volume 100 ON (step S1).

Then, the reset signal RSTN is output from the power-ON reset circuit 15. Then, the control circuit 18 receives the reset signal RSTN and then outputs the offset cancel·enable signal /ENBL (low level) to start the offset cancel (correction) (step S2).

This start of the offset cancel (correction) may be executed based on an external request (signal /CB).

The offset determining circuit 10 is started by the output of the offset cancel enable·signal /ENBL (low level) in step S2. Then, the oscillation circuit 16, when receives the offset cancel·enable signal /ENBL (low level), oscillates to output the clock signal C20US in a period 20 µs, for example. At this time, the output signal /MASK output from the control circuit 18 is set at a low level. Then, the control circuit 18 outputs the volume value signal (gain control signal) DEE so as to increase the gain (amplification factor) of the gain varying portion 1 (e.g., 46 dB) and cut off the input of the gain varying portion 1 (ground potential) during when the output signal /MASK is set at a low level (e.g., 160 ms).

This volume value signal DEE is held in the decoder (volume register) 5 in the gain varying portion 1. Then, the decoder 5 outputs the volume value signal DEE as the signals SA, SB to control the values of the variable resistors 3, 4. Thus, a tap of the variable resistor 3 in FIG. 3 is set to the left end in FIG. 3 and the plus input terminal of the OP amplifier 2 is connected to the ground. The gain varying portion 1 is brought into its state where the offset of the OP amplifier 2 can be detected precisely (step S3).

For example, suppose that, when the tap of the variable resistor 3 is set to the left end in FIG. 3, a resistance value of the tap of the variable resistor 3 on the leftmost side in FIG. 3 is set to "1" whereas a resistance value of the tap on the rightmost side in FIG. 3 is set to "199". The gain of about 200 (46 dB) is given by the OP amplifier 2 and the variable resistor 3 based on this resistance ratio of 1:199. When this state is set, the offset of the OP amplifier 2 is amplified by 46 dB and output.

In this state in step S3, since the clock signal CKCNT that the counter 12 receives is not generated yet, the counter 12 does not start the counting operation. Then, the control circuit 18 starts a zero-crossing timer counter by a built-in mask counter (not shown). This mask counter has a function of controlling a switching timing between the proper operational output of the gain varying portion 1 and the output for the offset correction. The mask counter measures a time interval 160 ms by counting the clock signal C20US in a 20 µs period 8000 times via the frequency divider circuit 17, for example, and generates a standby state for 160 ms (step S4).

Then, when 160 ms in step S4 lapsed, the output signal /MASK goes to a high level. Then, when the output signal /MASK is shifted to a high level, the clock signal CKCNT is input into the counter 12, so that the counter 12 is ready to start the counting operation and detect the offset determining signal (OFS) (step S5).

Here, the counter 12 is a 5-bit counter and its initial value is set to 10 h ("10" in the hexadecimal digit). Then, the counter 12 detects the offset value of the gain varying portion 1 by executing the up/down-counting operation in answer to the state of the offset determining signal OFS. In particular, the counter 12 executes the up-counting when the offset determining signal OFS is at a high level, while the counter 12 executes the down-counting when the offset determining signal OFS is at a low level (step S6).

Then, the offset of the OP amplifier 2 in the gain varying portion 1 is adjusted every one step by the offset adjusting data signal CALB that is the output of the counter 12. In the example shown in FIG. 9, since the offset determining signal OFS is at a high level, the offset adjusting data signal CALB is increased like 10 h, 11 h, 12 h, . . . , 1 Bh and thus the offset is stepwise reduced. Accordingly, the output signals CB0•4, CB1•4, CB2•4, CB3•4, /(CB0)•/4, /(CB1)•/4, /(CB2)•/4, /(CB3)•/4 of the decoder 21 shown in FIG. 7 are given as follows.

When the offset adjusting data signal CALB is set to 10 h, all the output signals CB0•4, CB1•4, CB2•4, CB3•4, /(CB0)•/4, /(CB1)•/4, /(CB2)•/4, /(CB3)•/4 are set to a low level.

In the bias varying portion 41 (FIG. 5), all the switches S11 to S14, S21 to S24 are connected to the Vg1 side and both the + side and the − side have the same bias value. In the variable resistor portion 42 (FIG. 6), only the switch S31 is turned ON and other switches are turned OFF, and the constant-current source is not connected to both sides.

When the offset adjusting data signal CALB is set to 11 h (CALB4=1, CALB3=0, CALB2=0, CALB1=0, CALB0=1), only one output signal CB0•4 goes to a high level and other output signals CB1•4, CB2•4, CB3•4, /(CB0)•/4, /(CB1)•/4, /(CB2)•/4, /(CB3)•/4 still remain at a low level.

In the bias varying portion 41 (FIG. 5), only the switch S11 is connected to the power-supply side and the transistor Tr12 is turned OFF to increase the + side bias value. In the variable resistor portion 42 (FIG. 6), the switches S31, S33 are turned ON to increase the + side current (corresponding to the reduction of the resistance) and lower the offset voltage.

When the offset adjusting data signal CALB is set to 12 h (CALB4=1, CALB3=0, CALB2=0, CALB1=1, CALB0=0), only one output signal CB1•4 goes to a high level and other output signals CB0•4, CB2•4, CB3•4, /(CB0)•/4, /(CB1)•/4, /(CB2)•/4, /(CB3)•/4 still remain at a low level.

In the bias varying portion 41 (FIG. 5), only the switch S12 is connected to the power-supply side and the transistor Tr13 is turned OFF. In the variable resistor portion 42 (FIG. 6), the switches S31, S32 are turned ON to increase further the + side current. The offset voltage is further lowered rather than the case of CALB=11 h.

Accordingly, the switches S11, S12, etc. shown in FIG. 5 are stepwise controlled, the transistors Tr12, Tr13, etc. are brought into their OFF-state. Further, the switches S31, S32, etc. shown in FIG. 6 are stepwise controlled to vary the + side (or the − side) current, so that the offset of the OP amplifier 2 is stepwise corrected (step S7).

Then, the control circuit 18 monitors the offset determining signal OFS to detect that the offset determining signal OFS is inverted from a high level to a low level (step S8).

Then, the control circuit 18 sets the offset cancel•enable signal /ENBL at a high level and sets the output signal /MASK at a low level. Thus, the offset adjusting data signal CALB is held to the value at that time, whereby the offset canceling operation is ended (steps S9, S10).

Then, the zero-crossing timer counter in the mask counter in the control circuit 18 is reset (step S11).

As described above, the offset canceling operation is started by the reset signal RSTN at the time of turning the power supply ON. But the similar operation to the above may be started by the control signal /CB fed from the outside. This is employed when the host system control portion (CPU) executes the offset canceling operation of the electronic volume 100 as occasion demands.

As described above, the electronic volume 100 according to the present invention can correct precisely the offset of the amplifier circuit (the OP amplifier 2) as the constituent element. As a result, the electronic volume in which the noise generation is extremely small can be manufactured.

With the above, embodiments of the present invention are described in detail with reference to the drawings. The concrete configurations are not limited to these embodiments, and change of design, etc. within a scope that does not depart from the gist of the present invention are contained in the present invention.

In the above embodiments, the example is shown in which both the bias varying portion 41 and the variable resistor portion 42 are provided to adjust the offset. In this case, only any one of the bias varying portion 41 and the variable resistor portion 42 may be employed, in view of requests of the transistors constituting the circuit, the offset output value, etc. When employing such configuration, the variable range becomes small but the circuit configuration can be simplified much more.

The offset correcting circuit according to the present invention can be realized by an offset determining circuit itself. That is, the general OP amplifier having an offset adjusting circuit can be a subject to an offset correct if the offset determining circuit is configured therefor.

As described above, according to the present invention, the offset correcting circuit and the electronic volume capable of reducing simply the offset of the amplifier circuit with high precision can be provided.

According to the present invention, the offset correcting circuit and the electronic volume capable of reducing simply the offset of the electronic volume with high precision can be provided.

According to the present invention, the electronic volume capable of reducing simply the noise generated in the electronic volume to cause the offset of the amplifier circuit with high precision can be provided.

What is claimed is:

1. An offset correcting circuit comprising:
an amplifying unit including an offset adjusting unit that adjusts an offset of the amplifying unit;
an offset determining unit that detects the offset of the amplifying unit and outputs a signal for correcting the offset of the amplifying unit; and
a power-ON detecting unit that detects a power ON signal to output a reset signal which causes the offset determining unit to start correcting the offset, wherein
the offset determining unit includes a comparing unit that compares an output of the amplifying unit with a reference value, and a counter that increases or decreases a count value in response to an output of the comparing unit, and
the offset adjusting unit includes a bias varying portion having a plurality of transistors connected in parallel with each other and which varies a bias of the amplifying unit by changing on/off states of the plurality of transistors based on the count value of the counter, thereby adjusting the offset.

2. The offset correcting circuit according to claim 1, wherein the offset adjusting unit further includes a variable resistor portion which is a part of a first-stage amplifying portion of the amplifying unit.

3. An electronic volume setting circuit comprising:
an inputting portion to which an input signal is input;
an amplifying unit that amplifies the input signal;
an outputting portion that outputs an output signal from the amplifying unit;
a variable resistor that negatively feeds back a signal output from the amplifying unit to an input of the amplifying unit, wherein the amplifying unit and the variable resistor constitute a gain varying unit that varies a gain of the electronic volume setting circuit;
an offset determining unit that determines an offset that includes a comparing unit for comparing the output signal output from the outputting portion with a reference value, and a counter for executing an up-count or a down-count in response to an output of the comparing unit;
a power-ON detecting unit that detects a power ON signal to output a reset signal which causes the offset determining unit to start correcting the offset; and
an offset adjusting unit that includes a bias varying portion having a plurality of transistors connected in parallel with each other and varies a bias of the amplifying unit by changing on/off states of the plurality of transistors based on a count value of the counter, thereby adjusting the offset.

4. The electronic volume setting circuit according to claim 3, wherein the offset adjusting unit further includes a variable resistor portion which is a part of a first-stage amplifying portion of the amplifying unit.

* * * * *